(12) United States Patent
Jung

(10) Patent No.: US 7,279,736 B2
(45) Date of Patent: Oct. 9, 2007

(54) NONVOLATILE MEMORY DEVICE AND METHODS OF FABRICATING AND DRIVING THE SAME

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 23 days.

(21) Appl. No.: 11/024,210

(22) Filed: Dec. 27, 2004

(65) Prior Publication Data

US 2005/0142748 A1 Jun. 30, 2005

(30) Foreign Application Priority Data

Dec. 26, 2003 (KR) ............... 10-2003-0097915
Dec. 31, 2003 (KR) ............... 10-2003-0101073
Dec. 31, 2003 (KR) ............... 10-2003-0101074

(51) Int. Cl.
*H01L 29/788* (2006.01)

(52) U.S. Cl. ............... 257/315; 438/257; 257/E21.662; 257/E21.679

(58) Field of Classification Search ........ 257/314–317; 438/201, 211, 257
See application file for complete search history.

(56) References Cited

U.S. PATENT DOCUMENTS

| 6,153,904 | A * | 11/2000 | Yang ............... 257/316 |
| 6,667,508 | B2 | 12/2003 | Lin et al. |
| 6,667,510 | B2 | 12/2003 | Wu |
| 6,784,480 | B2 * | 8/2004 | Bhattacharyya ............... 257/314 |
| 2004/0013001 | A1 * | 1/2004 | Park et al. ............... 365/185.28 |
| 2006/0011966 | A1 * | 1/2006 | Wang ............... 257/315 |

OTHER PUBLICATIONS

Hiroyuki Doi; Nonvolatile Semiconductor Memory and its Manufacturing Method; Publication No. 2001-298099; Patent Abstracts of Japan; Published Oct. 26, 2001.
Koji Kanamori and Yoshioki Hisamune; Nonvolatile Semiconductor Memory Device and Production Process Thereof; Publication No. 07-153857; Patent Abstracts of Japan; Published Jun. 16, 1995.
English Translation of Abstract Korean Patent No. 0271407; Nov. 15, 2000.
Office Action dated Oct. 26, 2005; Korean Patent Application No. 10-2003-0101074; 2 Pgs.
Office Action dated Nov. 28, 2005; Korean Patent Application No. 10-2003-0087915; 1 Pg.
Office Action dated Nov. 28, 2005; Korean Patent Application No. 10-2003-0101073; 2 Pgs.

* cited by examiner

*Primary Examiner*—Quoc Hoang
(74) *Attorney, Agent, or Firm*—Andrew D. Fortney

(57) ABSTRACT

Nonvolatile memory devices and methods of fabricating and driving the same are disclosed. Disclosed devices and method comprises: growing an oxide layer on a substrate and depositing a nitride layer on the oxide layer; patterning the nitride layer; forming injection gates on the lateral faces of the nitride layer; depositing a first polysilicon, a dielectric layer and a second polysilicon on the surface of the resulting structure, sequentially; patterning the second polysilicon, the dielectric layer and the second polysilicon to form gate electrodes; removing the nitride layer between the injection gates; forming source and drain extension regions around each of the gate electrodes by performing an ion implantation process; forming sidewall spacers on the lateral faces of the gate electrodes; and forming source and drain regions in the substrate by performing an ion implantation process with the sidewall spacers as an ion implantation mask.

28 Claims, 11 Drawing Sheets

NONVOLATILE MEMORY DEVICE AND METHODS OF FABRICATING AND DRIVING THE SAME

FIELD OF THE INVENTION

The present disclosure relates to a nonvolatile memory and, more particularly, to nonvolatile memory devices and methods of fabricating and driving the same.

BACKGROUND

Generally, semiconductor memory devices are divided into volatile memories and nonvolatile memories. The volatile memories, including chiefly random access memories (RAM) such as dynamic random access memories (DRAM) and static random access memories (SRM), retain their memory data when the power is turned on, but lose the stored data when the power is turned off. In contrast, the nonvolatile memories, including chiefly read only memories (ROM), retain their memory data even after the power is turned off.

The nonvolatile memories may be subdivided into ROM, programmable ROM (PROM), erasable PROM (EPROM), and electrically erasable PROM (EEPROM).

From the view point of process technology, the nonvolatile memories may be divided into a floating gate family and a metal insulator semiconductor (MIS) family comprising a multi-layer of two or more dielectrics. The memory devices of the floating gate family use potential wells to achieve memory characteristics. For instance, EPROM tunnel oxide (ETOX) structure and split gate structure are widely applied to flash EEPROM. The split gate structure comprises two transistors in one cell. On the other hand, the memory devices of the MIS family perform memory functions by using traps positioned on a dielectric bulk, the interface between dielectrics, and the interface between the dielectric and the semiconductor. At present, the MONOS (metal oxide nitride oxide semiconductor)/SONON (semiconductor oxide nitride oxide semiconductor) structure is chiefly being employed for flash EEPROM.

FIG. 1 is a cross-sectional view of a flash memory cell structure formed by a conventional technology. Referring to FIG. 1, a gate oxide layer 12 is deposited on a semiconductor substrate 10 having at least one device isolation layer 11. A first polysilicon layer 13 is deposited on the gate oxide layer 12. The first polysilicon layer 13 is used as a floating gate. A dielectric layer 15 and a second polysilicon layer 16 are sequentially deposited on the first polysilicon layer 13. The second polysilicon layer 16 is used as a control gate. A metal layer 17 and a nitride layer 18 are sequentially deposited on the second polysilicon layer 16. A cell structure is patterned to complete a flash memory cell by removing some portion of the gate oxide layer 12, the first polysilicon layer 13, the dielectric layer 15, the second polysilicon layer 16, the metal layer 17, and the nitride layer 18.

The above-mentioned flash memory cell has flat-plate type floating gate and control gate. Generally, in a flash memory, an electric potential of a control gate has to be thoroughly transferred into a floating gate to enhance the erase and program characteristics of a device. In detail, when a flash memory performs a program function using hot carriers, the voltages of 0 V, 5 V, and 9V are applied to a source, a drain, and a control gate, respectively. Here, if the voltage applied to the control gate is thoroughly transferred in a gate oxide via a floating gate and forms an electric field, hot electrons are more rapidly inpoured into the floating gate. Contrarily, when the flash memory performs an erase function, the voltages of −7 V and 5 V are applied to the control gate and the source, respectively. In this case, electrons in the floating gate move toward the source by Fowler-Nordheim (F-N) tunneling. Here, if the capacitance between the control gate and the floating gate is high and the capacitance between the floating gate and a substrate is low, the voltage of the floating gate is maintained at a much lower value and, therefore, the more electrons move toward the source to increase the erase speed. In conclusion, in performing program or erase function, the smaller the voltage difference between the floating gate and the control gate becomes, the faster the operation speed of a flash memory becomes.

To improve program and erase characteristics of a semiconductor device, a method of using a material with high dielectric constant as a dielectric layer between a floating gate and a control gate has been suggested. However, the suggested method is being developed at present and requires more technical development.

Additionally, as the conventional nonvolatile memory continuously performs program operations by hot electron injection, the hot electrons may generate trap sites in the interface between the tunnel oxide layer and the substrate, the interface between tunnel oxide layer and the floating gates, and the inside of the tunnel oxide layer. The trap sites can change the threshold voltage of the memory device and be used as an exit of the electrons which causes the rapid loss of the charge, thereby detrimentally affecting the characteristics of the memory device such as endurance and retention.

SUMMARY OF THE INVENTION

Accordingly, the present invention is directed to a nonvolatile memory device and methods of fabricating and driving the same that substantially obviate one or more problems due to limitations and disadvantages of the related art.

An object of the present invention is to provide a NOR flash cell array comprising injection gates in the floating gates, effectively performing program/erase/read operations, and obviating various problems such as over-erase and drain turn-on and drain disturb.

Another object of the present invention is to provide a driving method of a NOR flash memory device for performing program/erase/read operations stably.

Still another object of the present invention is to provide a fabrication method of a NOR flash device comprising injection gates in the floating gates, effectively performing program/erase/read operations, and obviating various problems such as over-erase and drain turn-on and drain disturb.

To achieve these objects and other advantages and in accordance with the purpose of the invention, as embodied and broadly described herein, the present invention provides a method of fabricating a flash memory device comprising: growing an oxide layer on a substrate and depositing a nitride layer on the oxide layer; patterning the nitride layer; forming injection gates on the lateral faces of the nitride layer; depositing a first polysilicon, a dielectric layer and a second polysilicon on the surface of the resulting structure, sequentially; patterning the second polysilicon, the dielectric layer and the second polysilicon to form gate electrodes; removing the nitride layer between the injection gates; forming source and drain extension regions around each of the gate electrodes by performing an ion implantation process; forming sidewall spacers on the lateral faces of the gate electrodes; and forming source and drain regions in the substrate by performing an ion implantation process with the sidewall spacers as an ion implantation mask.

In addition, the objects is achieved by a nonvolatile memory device comprising: a plurality of active regions on a semiconductor device, the active regions being defined by a plurality of device isolation layers; a tunnel oxide layer on the active regions; gate structures including floating gates, the floating gates facing each other at a distance on the tunnel oxide layer, ONO layers on each of the floating gates, control gates on each of the ONO layers and injection gates in one side of the lateral faces of each of the floating gates; a drain region in the semiconductor substrate, between the gates electrodes; and source regions in the semiconductor substrate, opposite to the drain region.

In addition, the object is achieve by a method for driving a nonvolatile memory device comprising: performing a program operation by applying a first data voltage to the first control line and applying a second data voltage to the second control line; performing a read operation by applying a first read voltage to the first control line and applying a second read voltage to the second control line; and performing an erase operation by applying a first erase voltage to the first control line, floating the second control line, applying a second erase voltage to the third control line, and applying a third erase voltage to the fourth control line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings.

FIGS. 2 through 6 are cross-sectional views illustrating an example process of fabricating a nonvolatile memory device performed in accordance with the teachings of the present invention.

Figure 1:
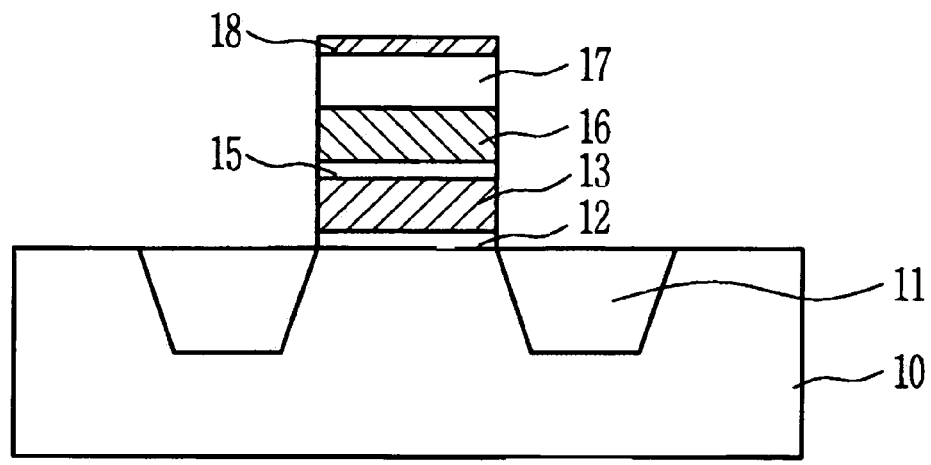
FIG. 1 is a cross-sectional view of a flash memory cell structure formed by a conventional technology.
Figure 2:
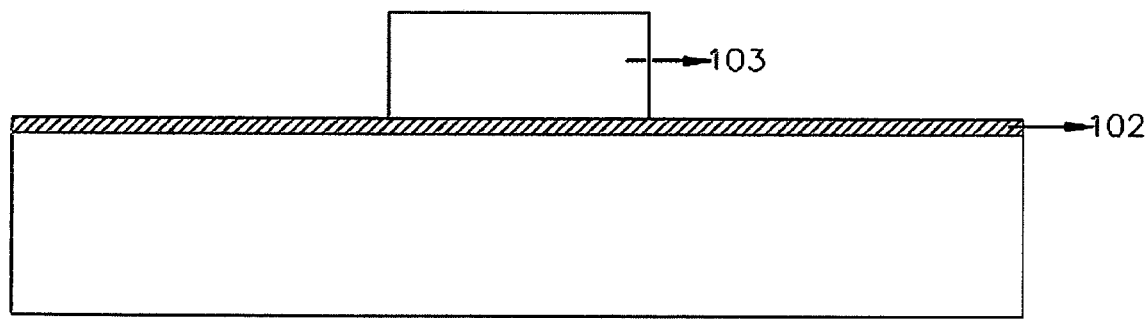
FIGS. 2 through 6 are cross-sectional views illustrating an example process of fabricating a nonvolatile memory device performed in accordance with the teachings of the present invention.

Referring to FIG. 2, a pad oxide layer 102 is grown on a p-type silicon substrate 101. Subsequently, a nitride layer 103 is deposited on the pad oxide layer 102. After a mask pattern for a drain region is formed on the nitride layer 103, the nitride layer 103 is etched by using the mask pattern. The nitride layer 103 can be replaced with an oxide layer or other insulating layers. In addition, the nitride layer 103 preferably has a thickness between 500 Å and 2500 Å.

Figure 3:
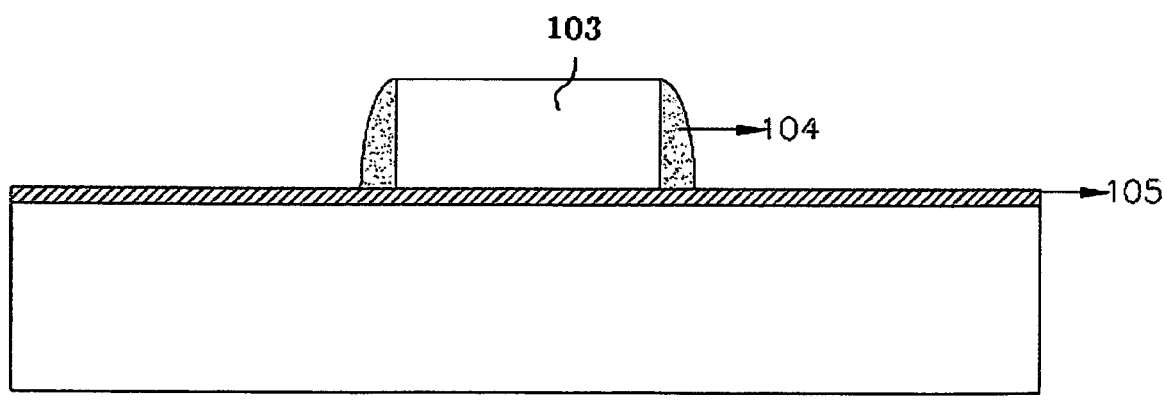

Referring to FIG. 3, the pad oxide layer 102 is removed except the area under the nitride layer 103. Subsequently, a tunnel oxide layer 105 is grown through an oxidation process with a thickness between 60 Å and 120 Å. A material for injection gates whose band gap is greater than that of the substrate 101 and less than that of the tunnel oxide layer 105 is deposited on the entire surface of the resulting structure with a thickness between 100 Å and 1000 Å. Subsequently, an anisotropic blanket etch is performed to form sidewall shaped injection gates 104 on the lateral faces of the nitride layer 103. Any material whose band gap is between 1.1 eV and 9.0 eV can be used for the injection gates. Preferably, the material for the injection gates is an oxide material selected from the group consisting of $Al_2O_3$, $Y_2O_3$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_3O_3$, $Tb_2O_3$, $Dy_2O_3$, $Ho_2O_3$, $Er_2O_3$, $Tm_2O_3$, $Yb_2O_3$ and $Lu_2O_3$. In addition, the material for the injection gate is preferably a compound semiconductor selected from the group consisting of SiC, AlP, AlAs, AlSb, GaP, GaAs, InP, ZnS, ZnSe, ZnTe, CdS, CdSe and CdTe.

Figure 4:
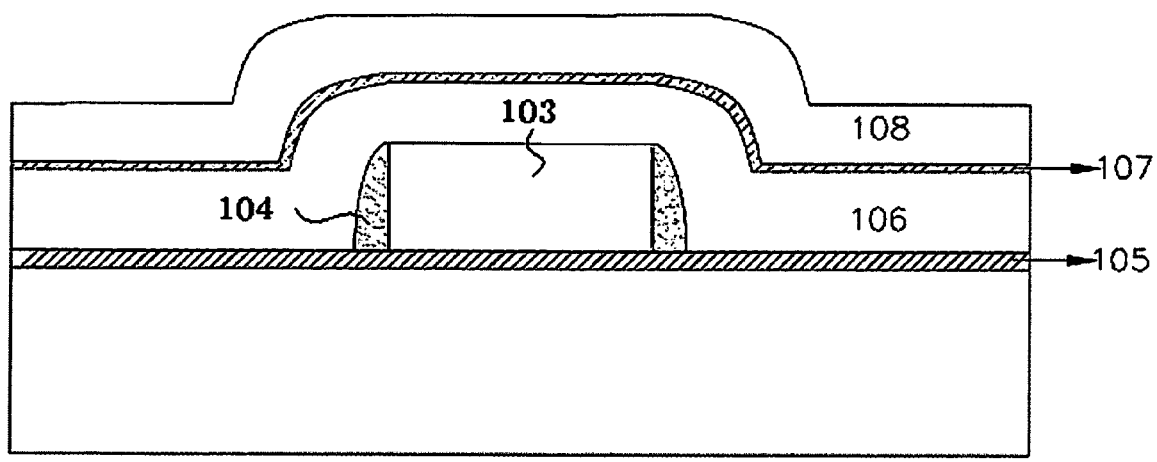

Referring to FIG. 4, a first polysilicon 106 for floating gates is deposited on the entire surface of the resulting structure. Subsequently, an ONO (Oxide-Nitride-Oxide) layer 107 is deposited on the first polysilicon 106 to increase a coupling ratio. A second polysilicon 108 for a control gate is then deposited on the ONO layer 107. The first polysilicon 106 and the second polysilicon 108 are polysilicon doped with N-type impurities or have to be doped with N-type impurities after the deposition of the polysilicon. Because the tunnel oxide layer 105 can be damaged during the formation of the injection gates 104, the tunnel oxide layer 105 may be removed and then re-deposited before the deposition of the first polysilcion 106.

Figure 5:
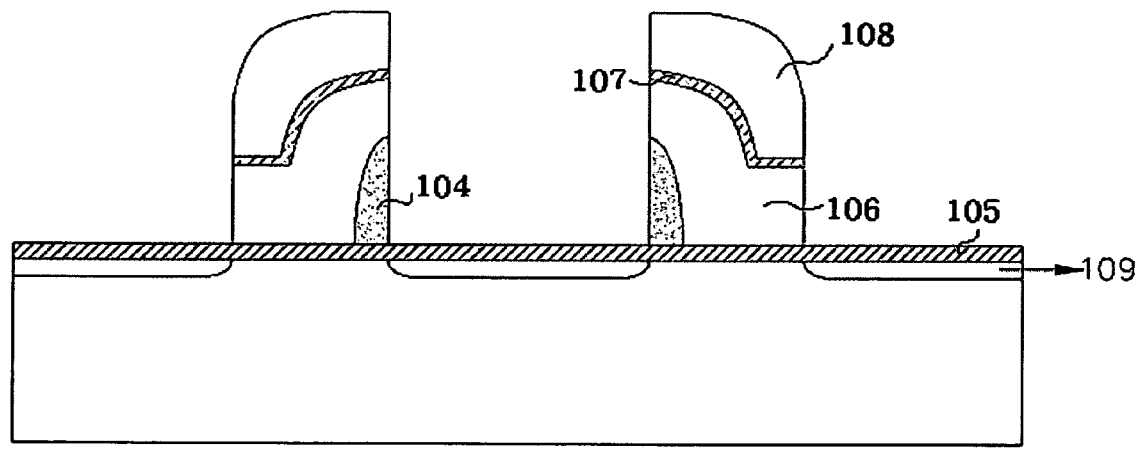

Referring to FIG. 5, after a photoresist pattern is formed on the second polysilicon 108 through a well-known photolithography process, the second polysilicon 108, the ONO layer 107 and the first polysilicon 106 are etched to form the floating gates and the control gates by using the photoresist pattern as an etch mask. Subsequently, the nitride layer 103 between the injection gates is removed by an wet etch using phosphoric acid or a dry etch. Subsequently, source and drain extension regions 109 are formed by an N-type impurity implantation.

Figure 6:
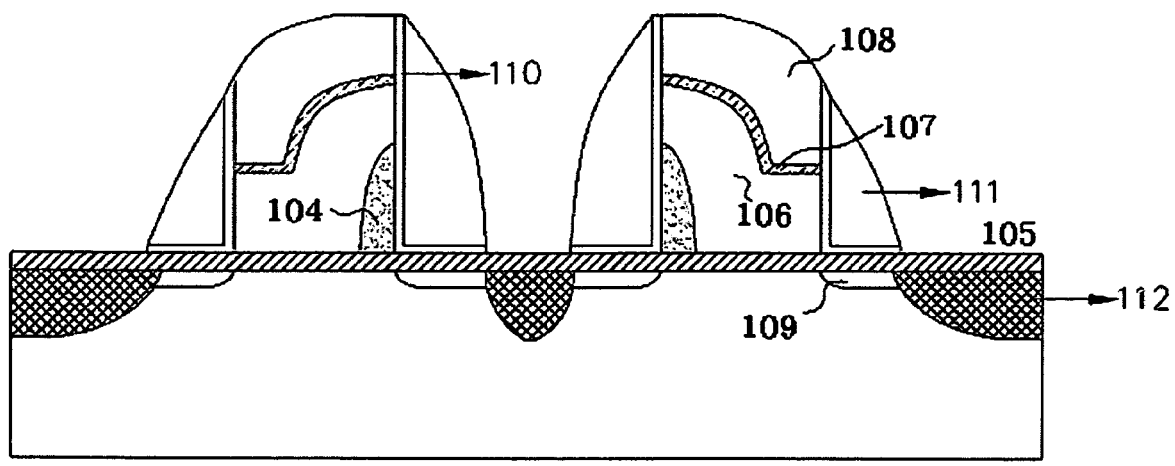

Referring to FIG. 6, an oxide layer 110 and a nitride layer are sequentially deposited on the surface of the resulting structure. Subsequently, an anisotropic etch is performed to form sidewall spacers 111 on the oxide layer 110. Source and drain regions 112 are formed in the substrate by implanting N-type impurities with the sidewall spacers as an ion implantation mask.

When program operation is performed in the nonvolatile memory device in accordance with the present invention, hot electron injection arises in the tunnel oxide layer under the injection gates. In detail, first, electrons are injected into the conduction band of the injection gates. The electrons in the conduction band of the injection gates are then moved to the conduction band of the floating gates which has a low and stable energy level. Thus, while the tunnel oxide layer under the injection gates functions as a tunnel oxide layer during the program operation, the tunnel oxide layer under the floating gates determines the real threshold voltage of the floating gate device. Consequently, even if the hot electron injection generates trap sites in the tunnel oxide layer under the injection gates or the interface between the tunnel oxide layer and the injection gates, the threshold voltage of the floating gate device will not be affected and, therefore, the endurance of the memory device is greatly improved. In addition, the hot electron injection cannot make trap sites in the tunnel oxide layer under the floating gates which have injected electrons and, thereby, the degradation of the retention characteristic due to the trap site can be effectively prevented.

For this nonvolatile memory device, an erase operation is performed by moving the electrons by various tunneling ways such as the FN-tunneling, the direct tunneling, and trap assisted tunneling so that the electrons are withdrawn from the silicon substrate, thereby decreasing the threshold voltage. And a read operation is performed by applying a middle voltage between the highest threshold voltage during the erase operation and the lowest threshold voltage during the program operation, and the state of the operations such as a program and erase is then detected.

Figure 7:
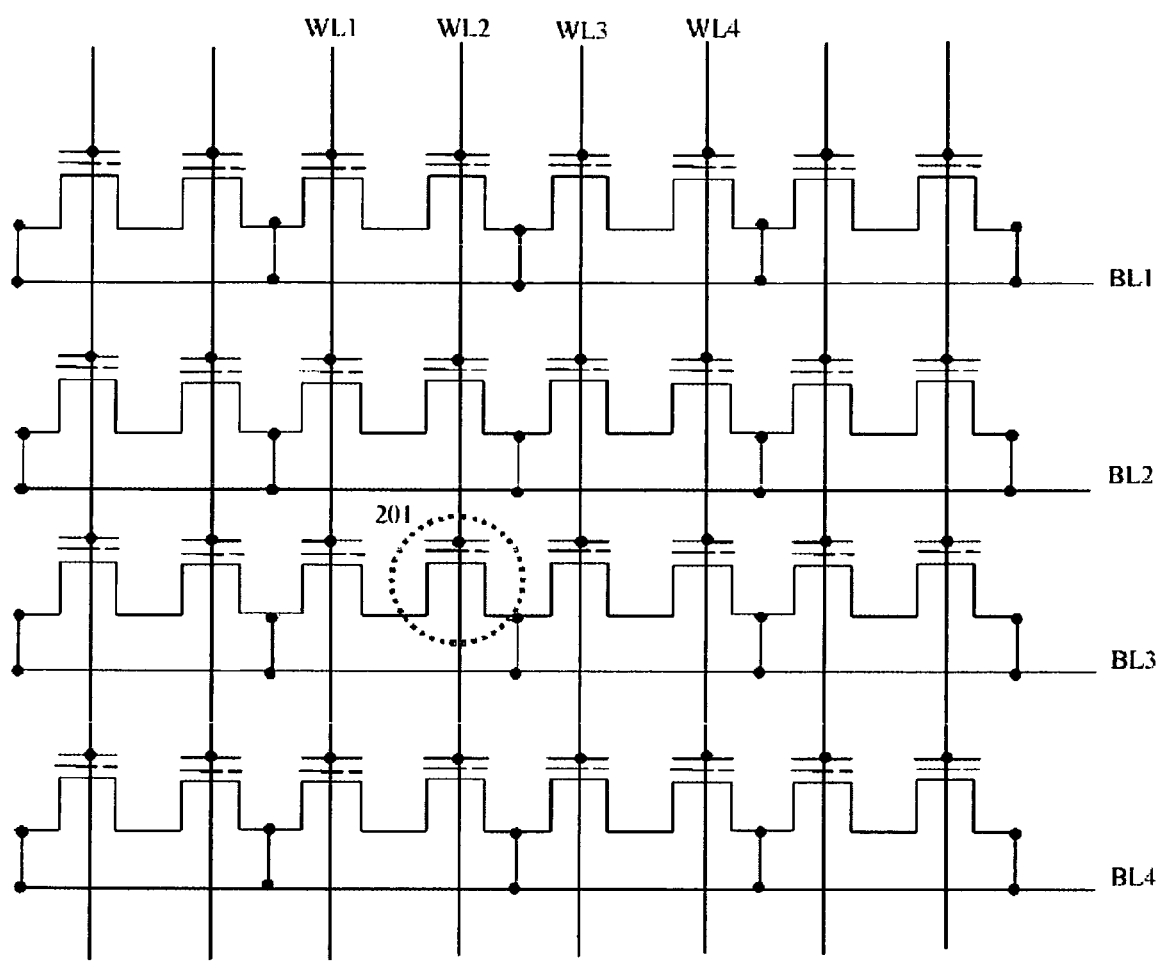
FIG. 7 is a top view of the NOR flash array in the non-volatile memory device in accordance with the present invention.

FIG. 7 is a top view of the NOR flash array in the non-volatile memory device in accordance with the present invention.

move to the potential well of the floating gate, thereby increasing the threshold voltage and achieving the program operation.

Here, optimum conditions for the Vblp[V] and the Vwlp [V] which are respectively applied to the bit line and the word line are determined in consideration of several factors such as hot electron injection efficiency, drain junction breakdowns, gate disturbance, program current, and drain disturbance.

The erase operation in the block level can be performed by two ways. One is to move electrons from the floating gate toward the channel by F/N-tunneling the electrons. The other is to carry electrons from the floating gate toward the source regions by the F/N-tunneling.

In Table 1, Erase1 is performed under a bias condition where electrons are moved from the floating gate toward the channel by the F/N-tunneling. In detail, −Vwle [V] is applied to the word lines (WL1, WL2, WL3, WL4), and 0[V] or Vb[V] are applied to the body, and the bit lines (BL1, BL2, BL3, BL4) and the source are floated to perform the Erase1.

Therefore, a strong electric field is applied from the channel toward the control gate, leading to moving the electrons contained in the potential well of the floating gate toward the substrate by the F/N-tunneling, thereby decreasing the threshold voltage and achieving the erase operation.

Erase2 is conducted under a bias condition where electrons are moved from the sidewall floating gate toward the source by the F/N-tunneling. In detail, −Vwle[V] is applied to the word lines (WL1, WL2, WL3, WL4), and 0[V] or Vs[V] is applied to the source, and the bit lines (BL1, BL2, BL3, and BL4) and the body are floated to perform the Erase2.

Therefore, a strong electric field is applied from the source region toward the control gates, leading to moving electrons contained in the potential well of the floating gates

TABLE 1

|  | WL1 | WL2 | WL3 | WL4 | BL12 | BL2 | BL3 | BL4 | Source | Body |
|---|---|---|---|---|---|---|---|---|---|---|
| Program | 0 | Vwlp | 0 | 0 | 0 | 0 | Vblp | 0 | 0 | 0 |
| Erase1 | −Vwle | −Vwle | −Vwle | −Vwle | F | F | F | F | F | 0/Vb |
| Erase2 | −Vwle | −Vwle | −Vwle | −Vwle | F | F | F | F | 0/Vs | F |
| Read | 0 | Vref | 0 | 0 | 0 | 0 | Vblr | 0 | 0 | 0 |

Table 1 illustrates the voltage applied to a control gate through a first control line (that is, a control gate line), a drain through a second control line (that is, a word line), a source through a third control line and a body through a fourth control line of a cell 201 selectively performing program, read, and erase operations in a block level.

The selective program operation is performed under a bias condition where Vwlp[V] is applied to just WL2 in the word lines, 0[V] is applied to the rest of the word lines(WL1, WL3, WL4), Vblp[V] is applied to the BL3, 0[V] is applied to the rest of the bit lines(BL1, BL2, BL4) and 0[V] is applied to the source and the body.

Under the bias condition described above, the bias is simultaneously applied to just the cell 201 whose the control gate is connected to the WL2 and the drain is connected to the BL3. Current flows from the drain region toward the source region and the hot electrons are then injected into the injection gate 103. As a result, the injected hot electrons toward the source region by the F/N tunneling, thereby decreasing the threshold voltage and then achieving the erase operation.

The read operation is performed under a bias condition where Vref[V] is applied to the WL2, Vblr[V] is applied to the BL3, and 0[V] is applied to the rest of the word lines (WL1, WL2, WL3), the rest of the bit line (BL1, BL2, BL4), the source and the body.

Under the condition described above, if the cell 201 in FIG. 7 is in erased state, current flows from the BL3 to the source region. If the cell 201 is in programmed state, a current does not flow from the BL3 to the source region. So, the program/erase state can be detected by the current flow.

Here, the Vref applied to the control gate during the read operation is generally determined as a middle voltage between the highest threshold voltage during the erase operation and the lowest threshold voltage during the program operation. In addition, a high voltage applied to the bit line during the read operation may induce an unintentional program operation. Thus, a sufficiently low voltage has to be applied to prevent the unintentional program operation.

Figure 8:
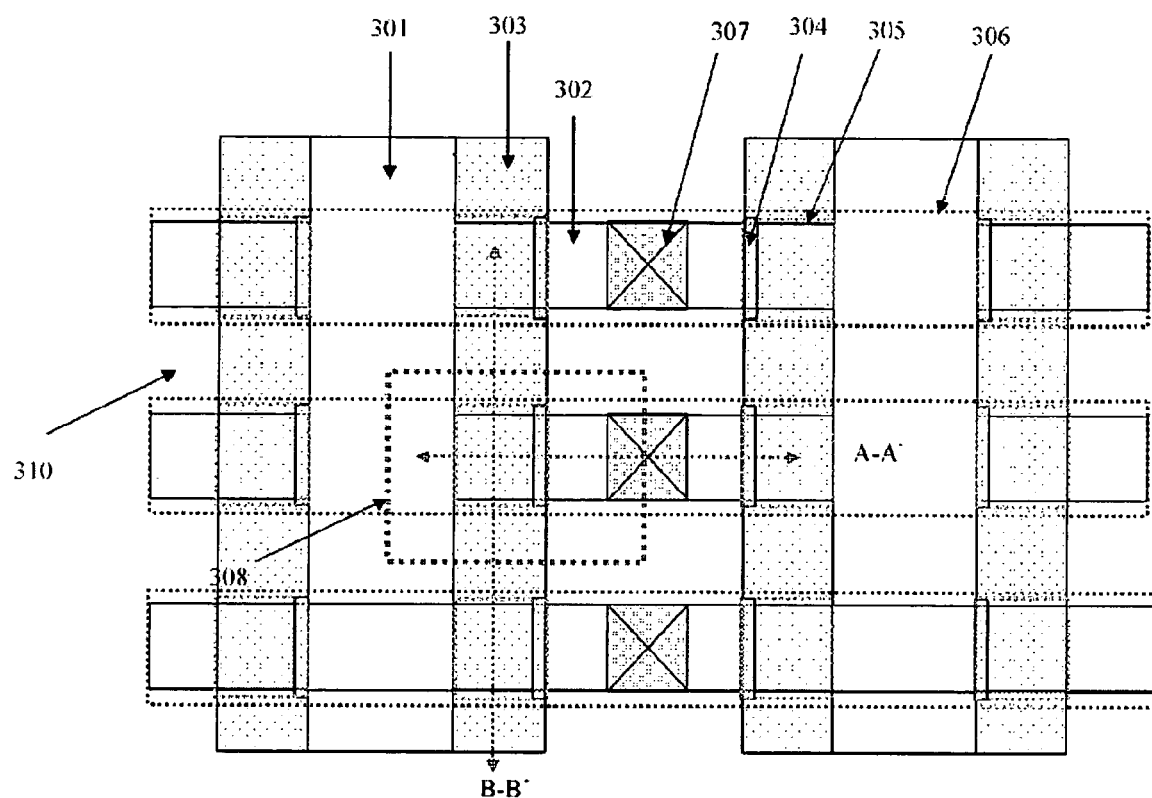
FIG. 8 is a cell layout of the NOR flash array in the non-volatile memory device in accordance with the present invention.

FIG. 8 is a cell layout of the NOR flash memory device in accordance with the present invention.

Reference number 308 in FIG. 8 depicts a unit cell of the flash memory device.

The source region of each unit cell is a common source region and the drain region of each unit cell is a common drain region shared by adjacent unit cell. The drain regions 302 are connected to the bit lines 306 through the contacts 307. Word lines and control gates 303 are placed over the floating gates 305. Injection gates are parallel to the word lines and positioned in one side of the floating gates toward the drain regions. The bit lines are insulated from each other by STI structures 310.

Figure 9:
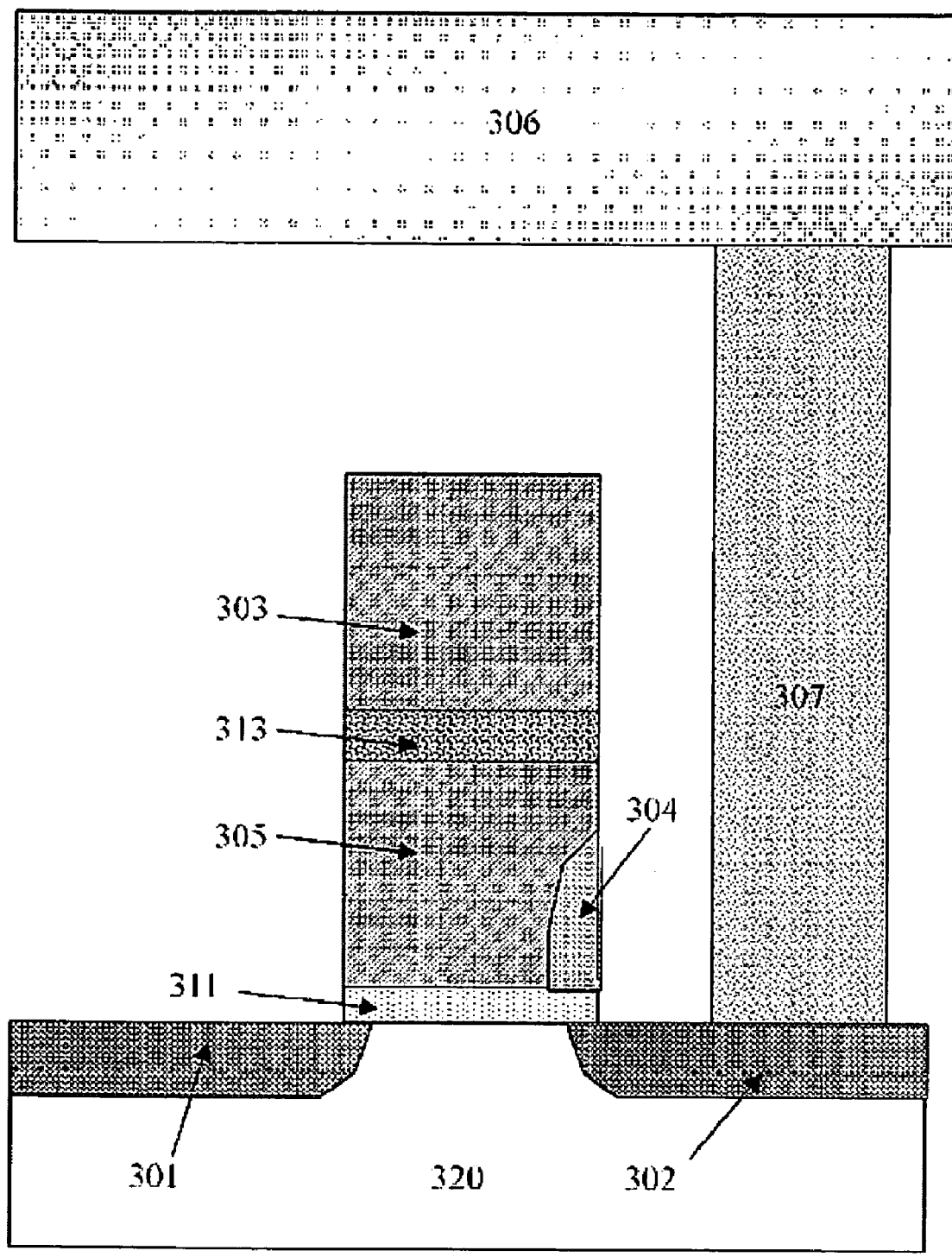
FIG. 9 is a cross-sectional view illustrating the unit cell 309 along the line A-A' in FIG. 8.

FIG. 9 is a cross-sectional view illustrating the unit cell 309 along the line A-A' in FIG. 8.

Referring to FIG. 9, a tunnel oxide layer 311, a floating gate 305, an injection gate 304, an ONO layer 313 and a control gate 303 are placed on a silicon substrate 401. A common source and drain regions 302 are placed around the tunnel oxide layer 311. A bit line contact 307 is placed on the common drain region 302. The metal bit line 306 interconnects all bit line contacts 307.

Figure 10:
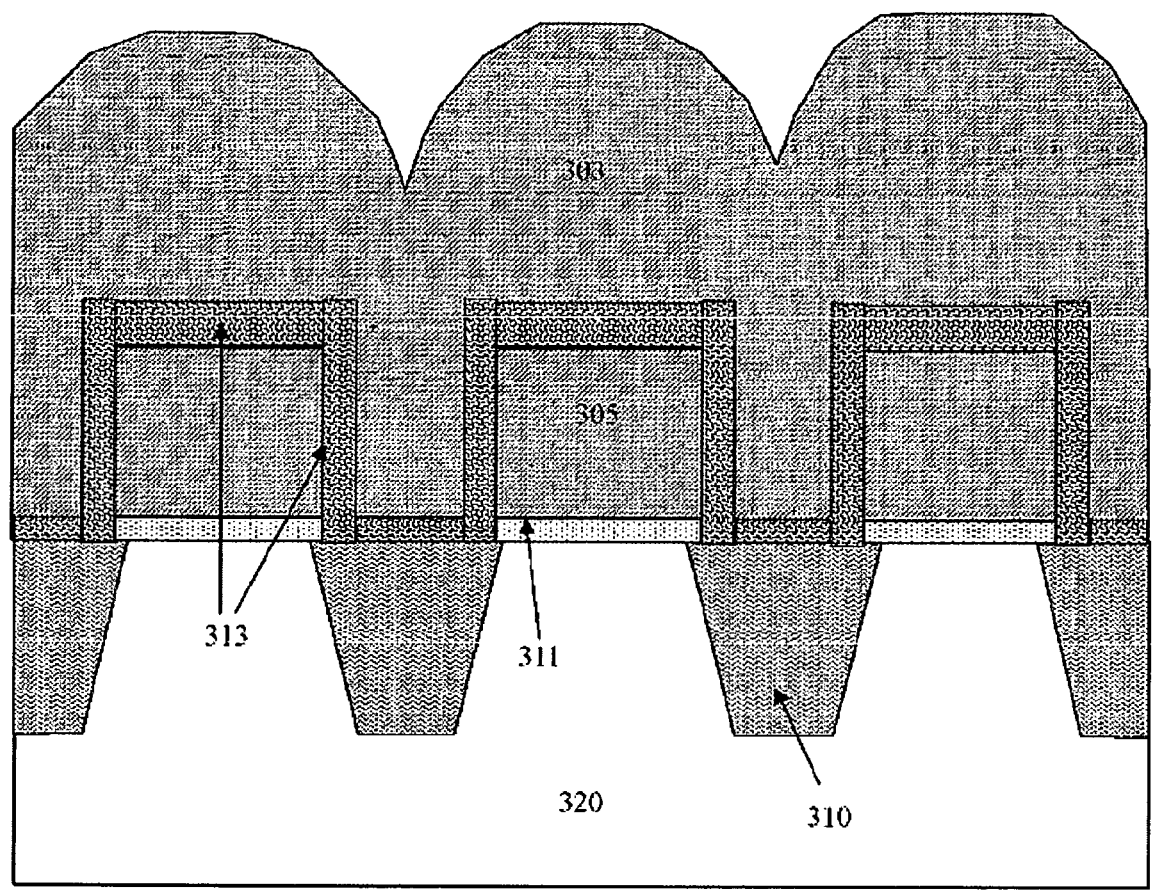
FIG. 10 is a cross-sectional view illustrating the unit cell 309 along the line B-B' in FIG. 8.

FIG. 10 is a cross-sectional view illustrating the unit cell 309 along the line B-B' in FIG. 8.

Referring to FIG. 10, tunnel oxide layers 311 and floating gates 305 are placed on a silicon substrate 320. The tunnel oxide layers 311 and the floating gates 305 are separated by the STI structures 310. ONO layers 313 are placed on the floating gates 305 and the tunnel oxide layer 311, and word line 303 is positioned on the ONO layers 313 covering the floating gates 305.

Figure 11:
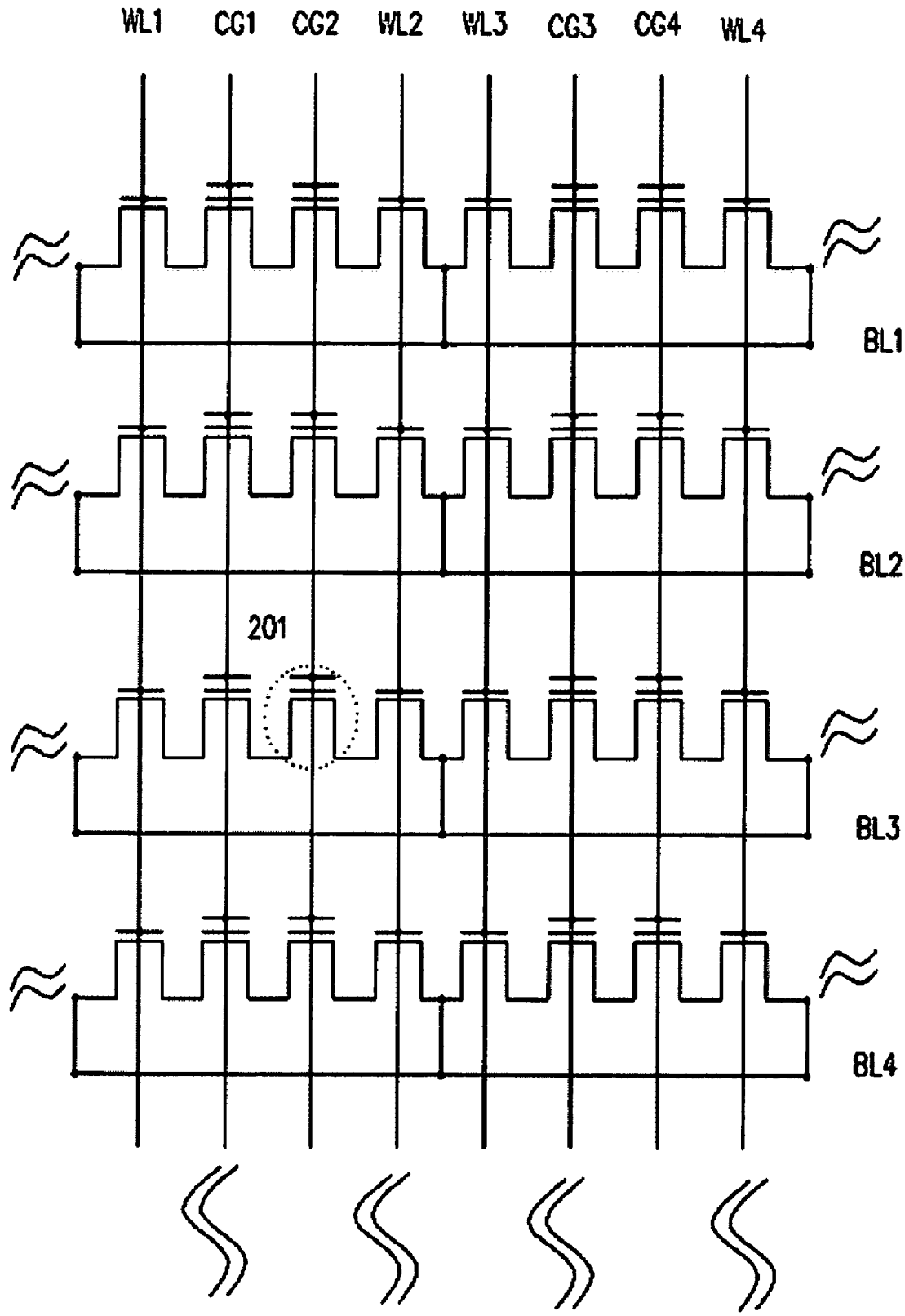
FIG. 11 is a cell layout of the NOR flash array having a select transistor in the non-volatile memory device in accordance with the present invention.

FIG. 11 is a top view of the NOR flash array having a select transistor in the non-volatile memory device in accordance with the present invention.

Table 2 lists the voltages respectively applied to a control gate through a first control line (that is, a control gate line), a select gate through a second control line (that is, a word line), a drain through a third control line (that is, a bit line), a source through a fourth control line and a body through a fifth control line of a cell 201 selectively performing program, read, and erase operations in a block level.

injected into the conduction band of the injection gates and the injected electrons are then moved to the potential well of the floating gates, thereby resulting in the increase of the threshold voltage and achieving a program operation.

Here, optimum conditions for the Vp, Vblp and the Vwlp which are respectively applied to the control gate, the bit line and the word line are determined in consideration of several factors such as hot electron injection efficiency, drain junction breakdowns, gate disturbance, program current, and the threshold voltage of the select transistor.

The erase operation in the block level can be performed by two ways. One is to move electrons from the floating gate toward the channel by F/N-tunneling the electrons. The other is to carry electrons from the floating gate toward the source regions by the F/N-tunneling. In Table 1, Erase1 is performed under a bias condition where electrons are moved from the floating gate toward the channel by the F/N-tunneling. In detail, −Ve[V] is applied to the control gates (CG1, CG2, CG3, CG4), and 0[V] or Vb[V] is applied to the body, and the word lines (WL1, WL2, WL3, WL4) and the bit lines (BL1, BL2, BL3, BL4) and the source are floated. Therefore, a strong electric field is applied from the channel toward the control gate, leading to moving the electrons contained in the potential well toward the substrate by the F/N-tunneling, thereby decreasing the threshold voltage and achieving a erase operation.

Erase2 is conducted under a bias condition where electrons are moved from the floating gate toward the source by the F/N-tunneling. In detail, −Ve[V] is applied to the control gates (CG1, CG2, CG3, CG4), and 0[V] or Vs[V] is applied to the source, and the word lines (WL1, WL2, WL3, WL4), the bit lines (BL1, BL2, BL3, BL4) and the body are floated. Therefore, a strong electric field is applied from the source toward the control gate, leading to moving electrons contained in the potential well toward the source region by the F/N tunneling, thereby decreasing the threshold voltage and achieving an erase operation.

The read operation is performed under a bias condition where Vref[V] is applied to the control gates (CG1, CG2, CG3, CG4), Vwlr[V] is applied to the WL2, Vblr[V] is applied to the BL3, and 0[V] is applied to the rest of the word lines (WL1, WL3, WL4), the rest of the bit line (BL1, BL2, BL4), and the source and the body.

Under the condition described above, if the cell 201 is in erased state, a current flows from the BL3 to the source

TABLE 2

|  | CG1 | CG2 | CG3 | CG4 | WL1 | WL2 | WL3 | WL4 | BL1 | BL2 | BL3 | BL4 | Source | Body |
|---|---|---|---|---|---|---|---|---|---|---|---|---|---|---|
| Program | Vp | Vp | Vp | Vp | 0 | Vwlp | 0 | 0 | 0 | 0 | Vblp | 0 | 0 | 0 |
| Erase1 | −Ve | −Ve | −Ve | −Ve | F | F | F | F | F | F | F | F | F | 0/Vb |
| Erase2 | −Ve | −Ve | −Ve | −Ve | F | F | F | F | F | F | F | F | 0/Vs | F |
| Read | Vref | Vref | Vref | Vref | 0 | Vwlr | 0 | 0 | 0 | Vwlr | 0 | 0 | 0 |

Referring to Table 2, the selective program operation is performed under a bias condition where Vp[V] is applied to control gates (CG1, CG2, CG3, CG4), Vwlp[V] is applied to just WL2 in the word lines, 0[V] is applied to the rest of the word lines (WL1, WL3, WL4), Vblp[V] is applied to just BL3 in the bit lines and, 0[V] is applied to the rest of the bit lines (BL1, BL2, BL4), the source and the body.

Under the condition described above, because a voltage is applied to the drain region only for the cell 201 through the bit line, a current flows from the source region toward the drain region only for the cell 201. Thus, hot electrons are region. If the cell is in programmed state, a current does not flow from the BL3 to the source region. Thus, the program/erase state can be detected by the current flow. Here, the Vref applied to the control gate during the read operation is generally determined as a middle voltage between the highest threshold voltage during the erase operation and the lowest threshold voltage during the program operation. In addition, a high voltage applied to the bit line during the read operation may induce an unintentional program operation. Thus, a sufficiently low voltage has to be applied to prevent the unintentional program operation.

Figure 12:
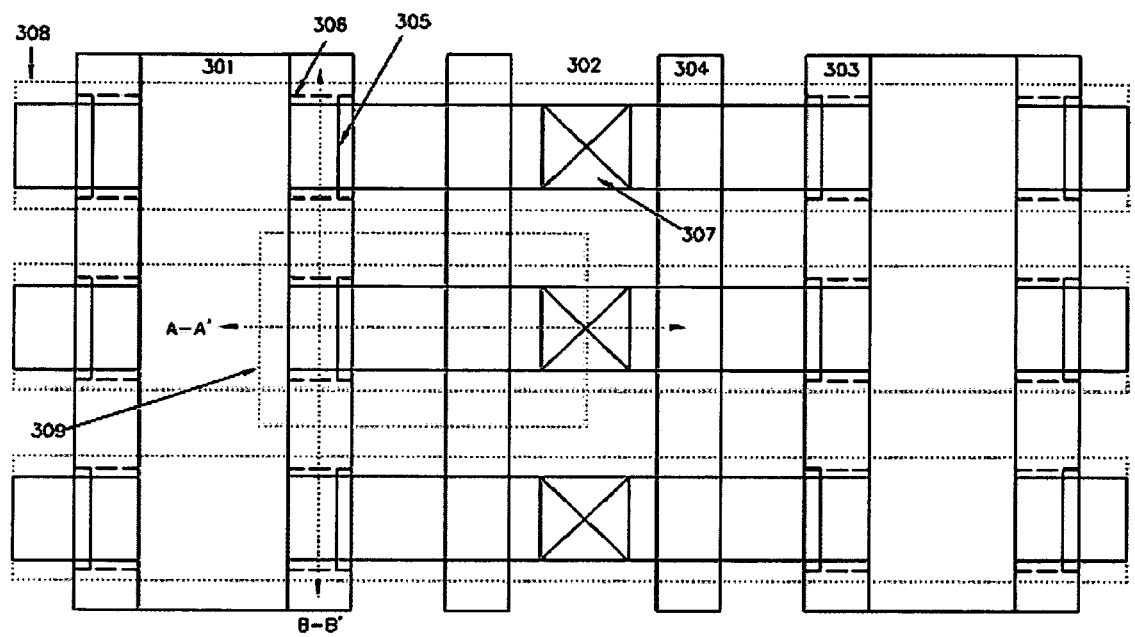
FIG. 12 is a cell layout of the NOR flash memory device having the select transistor in accordance with the present invention.

FIG. 12 is a cell layout of the NOR flash memory device having the select transistor in accordance with the present invention.

A pair of active regions 301, at least, are vertically placed on a semiconductor substrate. The active regions 301 are separated by device isolation structures 302. Several control gates 303 are horizontally positioned across the top of the vertically placed active regions 301. Select gates 304 parallel to the control gates 303 at a distance are placed across the top of the active regions. Floating gates 306 are positioned between the active regions 301 and each control gates 303. Injection gates 305 are placed between one lateral face of the floating gates 306 and the active regions 301. The injection gates 305 are placed adjacent to the select gates 304. Drain regions are placed between the select gates 304 and bit line contacts 307 are placed on the predetermined area of the drain regions. Bit lines 308 are placed over the active regions 301 at a distance. ONO layers are positioned between the floating gates 306 and the control gates 303. Tunneling layers are placed between the floating gates 306 and the active regions 301. The resulting structure is symmetric against the drain region.

Figure 13:
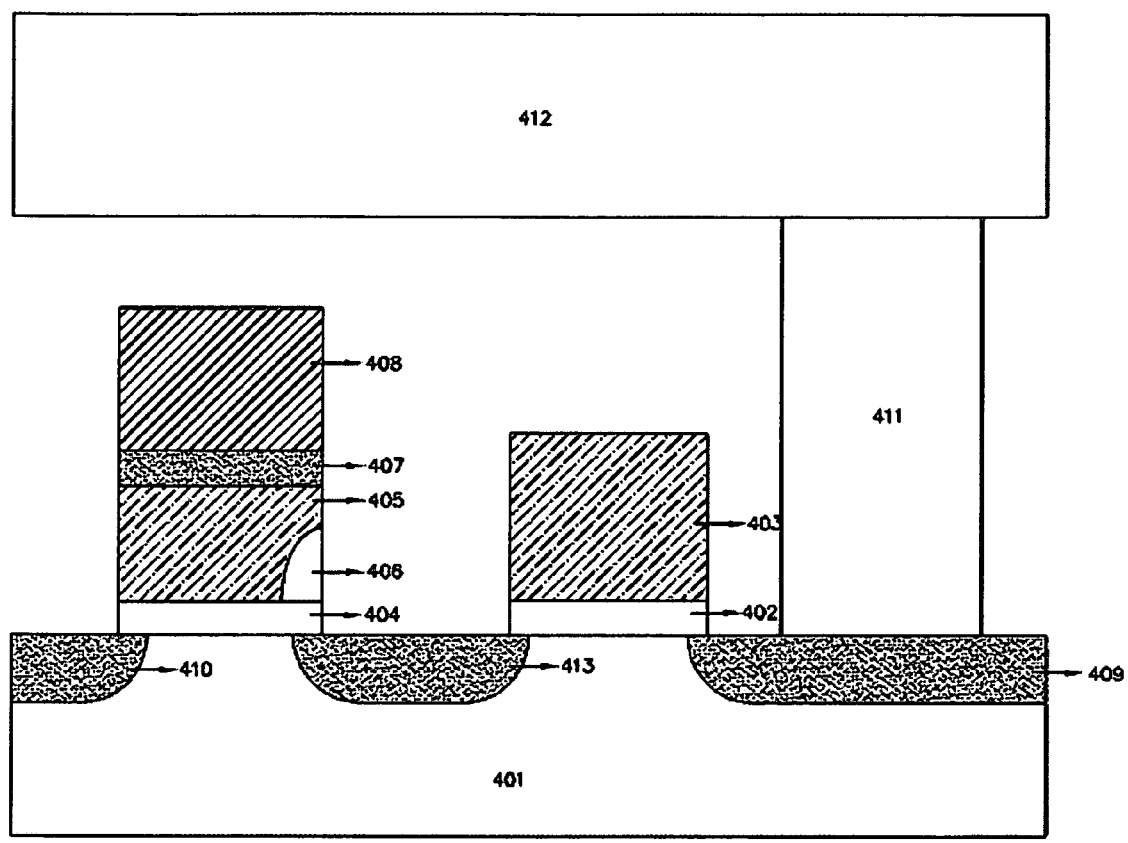
FIG. 13 is a cross-sectional view illustrating the unit cell 309 along the line A-A' in FIG. 12.

FIG. 13 is a cross-sectional view illustrating the unit cell 309 along the line A-A' in FIG. 12.

Referring to FIG. 13, a tunnel oxide layer 404, a floating gate 405, an injection gate 406, an ONO layer 407 and a control gate 408 are placed on a silicon substrate 401. A select gate 403 is positioned away from one side of the control gate 408. A drain region 409 is placed in the substrate adjacent to one side of the select gate 403. A source region 410 is placed in the substrate opposite to the drain region 409. A source and drain extension region 413 doped with highly concentrated impurities is placed between the source region 410 and the drain region 409. A bit line contact 411 is placed on the drain region 409. A metal bit line 412 interconnects all the bit line contacts.

Figure 14:
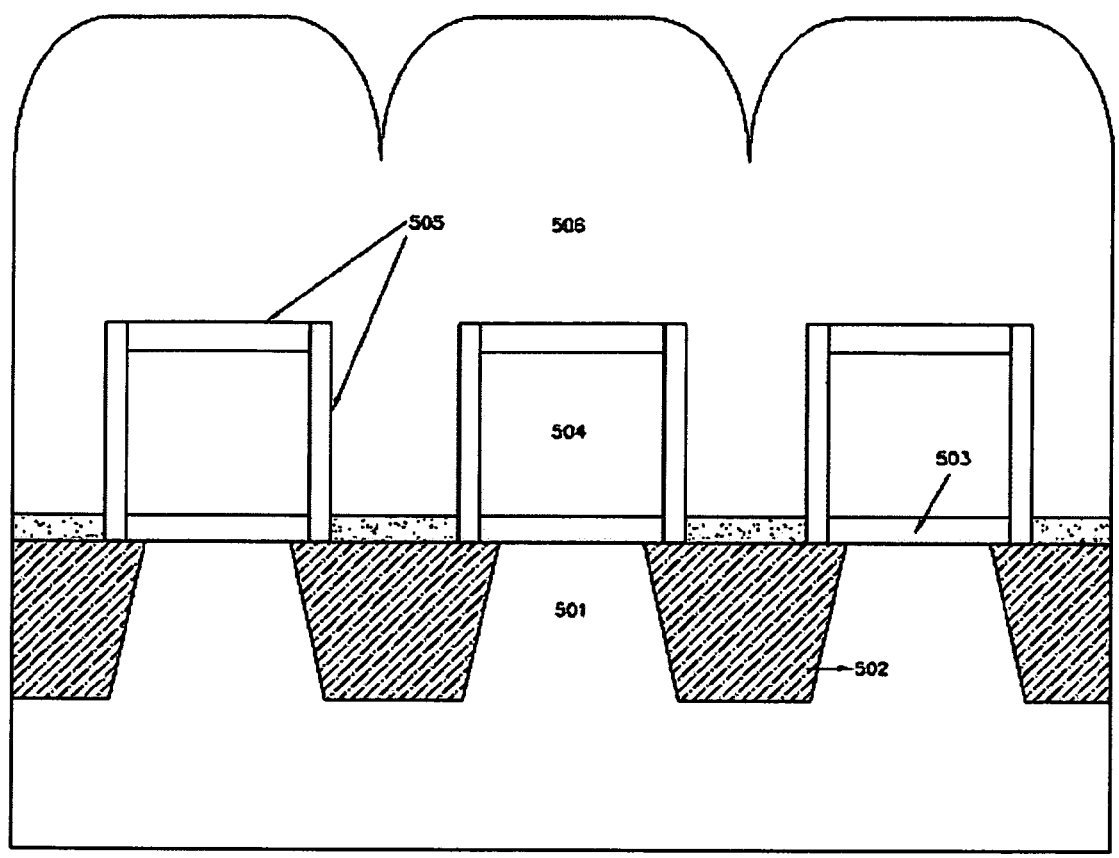
FIG. 14 is a cross-sectional view illustrating the unit cell 309 along the line B-B' in FIG. 12.

FIG. 14 is a cross-sectional view illustrating the unit cell 309 along the line B-B' in FIG. 12.

Referring to FIG. 13, tunnel oxide layers 503 and floating gates 504 are placed on active regions 501. Floating gates 504 are separated from each other by device isolation structures 502. ONO layers 505 are placed on the floating gates 504 and the tunnel oxide layers 503 and word line 506 is positioned on the ONO layers 505 covering the floating gates 504.

Accordingly, the present invention provides a NOR flash cell array comprising injection gates in the floating gates, effectively performing program/erase/read operations, and obviating various problems such as over-erase and drain turn-on and drain disturbance.

From the foregoing, persons of ordinary skill in the art will appreciate that the illustrated example process can reduce a cell size by constructing a NOR type array with mirror type symmetrical structure.

It is noted that this patent claims priority from Korean Patent Application Number 10-2003-0101073 and 10-2003-0101074, which were filed on Dec. 31, 2003, and Korean Patent Application Number 10-2003-0097915, which was filed on Dec. 26, 2003 and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacturing fairly falling within the scope of the appended claims either literally or under the doctrine of equivalents.

What is claimed is:

1. A nonvolatile memory device, comprising:
 a plurality of active regions on a semiconductor substrate, the active regions being defined by a plurality of device isolation layers;
 a tunnel oxide layer on the plurality of active regions;
 gate structures including floating gates, the floating gates facing each other at a distance on the tunnel oxide layer, oxide-nitride-oxide (ONO) layers on each of the floating gates, control gates on each of the ONO layers, and injection gates in contact with the floating gates;
 a drain region wherein the injection gates are made of a material selected from the group consisting of SiC, AlP, AlAs, AlSb, GaP, GaAs, InP, ZnS, ZnSe, ZnTe, CdS, CdSe and CdTe in the semiconductor substrate, between the gate structures; and
 source regions in the semiconductor substrate, on opposite sides of the gate structures from the drain region.

2. The nonvolatile memory device as defined by claim 1, further comprising:
 spacers on sidewalls of each of the gate structures; and
 source and drain extension regions in the semiconductor substrate, the source extension regions being adjacent to the source regions and the drain extension regions being adjacent to the drain region.

3. The nonvolatile memory device as defined by claim 1, further comprising:
 a bit line contact on the drain region.

4. The nonvolatile memory device as defined by claim 3, further comprising:
 a first control line connected to at least one of the control gates;
 a second control line connected to the bit line contact;
 a third control line connected to at least one of the source regions; and
 a fourth control line connected to the semiconductor substrate.

5. A method for driving the nonvolatile memory device of claim 4, comprising:
 performing a program operation by applying a first data voltage to the first control line and applying a second data voltage to the second control line;
 performing a read operation by applying a first read voltage to the first control line and applying a second read voltage to the second control line; and
 performing an erase operation by applying a first erase voltage to the first control line, floating the second control line, applying a second erase voltage to the third control line, and applying a third erase voltage to the fourth control line.

6. The method for driving a nonvolatile memory device as defined by claim 5, wherein 0[V] is applied to the third and the fourth control lines for the program and the read operations.

7. The method for driving a nonvolatile memory device as defined by claim 5, wherein the second erase voltage is a floating voltage and the third erase voltage is a predetermined voltage to erase stored electrons.

8. The method for driving a nonvolatile memory device as defined by claim 5, wherein the second erase voltage is a predetermined voltage to erase stored electrons and the third erase voltage is a floating voltage.

9. The method for driving a nonvolatile memory device as defined by claim 5, wherein a sign of the first data voltage is opposite to that of the first erase voltage.

10. The nonvolatile memory device as defined by claim 1, further comprising:
a select gate on the semiconductor substrate, between at least one of the gate structures and the drain region; and
a bit line contact on the drain region.

11. The nonvolatile memory device as defined by claim 10, further comprising:
a first control line connected to at least one of the control gates;
a second control line connected to the select gate;
a third control line connected to the bit line contact;
a fourth control line connected to at least one of the source regions; and
a fifth control line connected to the semiconductor substrate.

12. The method for driving the nonvolatile memory device of claim 11, comprising:
performing a program operation by applying a first data voltage to the first control line, applying a second data voltage to the second control line and applying a third data voltage to the third control line;
performing a read operation by applying a first read voltage to the first control line, applying a second read voltage to the second control line and the third control line; and
performing an erase operation by applying a first erase voltage to the first control line, floating the second control line, and the third control line, and applying a second erase voltage to the fourth control line, and applying a third erase voltage to the fifth control line.

13. The method for driving a nonvolatile memory device as defined by claim 12, wherein 0[V] is applied to the fourth and the fifth control lines for the program and the read operations.

14. The method for driving a nonvolatile memory device as defined by claim 12, wherein the second erase voltage is a floating voltage and the third erase voltage is a predetermined voltage to erase stored electrons.

15. The method for driving a nonvolatile memory device as defined by claim 12, wherein the second erase voltage is a predetermined voltage and the third erase voltage is a floating voltage to erase stored electrons.

16. The method for driving a nonvolatile memory device as defined by claim 12, wherein a sign of the first data voltage is opposite to that or the first erase voltage.

17. The nonvolatile memory device as defined by claim 1, wherein the injection gates comprise a material having a band gap that is greater than that of silicon and less than that of $SiO_2$.

18. The nonvolatile memory device as defined by claim 1, wherein the injection gates comprise a material selected from the group consisting of: $Al_2O_3$, $Y_2O_3$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

19. The nonvolatile memory device as defined by claim 1, wherein hot electron injection arises in the tunnel oxide layer under the injection gates.

20. The nonvolatile memory device as defined by claim 1, wherein an erase operation is performed by moving electrons from the floating gates toward the semiconductor substrate by F/N-tunneling.

21. The nonvolatile memory device as defined by claim 1, wherein a read operation detects a current flow by applying a voltage to at least one of the control gates, wherein the voltage is between a highest threshold voltage during an erase operation and a lowest threshold voltage during a program operation.

22. The nonvolatile memory device as defined by claim 1, wherein a portion of the injection gate is formed on a same horizontal plane with the floating gates.

23. The nonvolatile memory device as defined by claim 1, wherein the injection gates are aligned with lateral faces of the floating gates.

24. The nonvolatile memory device as defined by claim 1, wherein the injection gates are in contact with the tunnel oxide layer.

25. A nonvolatile memory device, comprising:
a tunnel oxide layer on a semiconductor substrate;
an injection gate on the tunnel oxide layer, the injection gate comprising a material having a band gap that is greater than that of silicon and less tan that of $SiO_2$;
a floating gate directly on the tunnel oxide layer and in contact with the injection gate;
an oxide-nitride-oxide (ONO) layer on the floating gate; and
a control gate on the ONO layer wherein the injection gates comprises a material selected from the group consisting of SiC, AlP, AlAs, AlSb, GaP, GaAs, lnP, ZnS, ZnSe, ZnTe, CdS, CdSe and CdTe.

26. The nonvolatile memory device of claim 25, wherein the injection gate comprises a material selected from the group consisting of $Al_2O_3$, $Y_2O_3$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

27. The nonvolatile memory device of claim 25, wherein the floating gate is programmed by hot electron injection through the tunnel oxide layer under the injection gate.

28. The nonvolatile memory device of claim 25, wherein the injection gate has a curved shape, and the floating gate, the ONO, and the control gate conform to the curved shape of die injection gate.

* * * * *